US012218162B2

(12) United States Patent
Pertl et al.

(10) Patent No.: US 12,218,162 B2
(45) Date of Patent: Feb. 4, 2025

(54) OPTOELECTRONIC DEVICE AND METHOD OF PRODUCING AN OPTOELECTRONIC DEVICE

(71) Applicant: ams AG, Premstätten (AT)

(72) Inventors: Patrik Pertl, Premstätten (AT); Gerhard Eilmsteiner, Premstätten (AT)

(73) Assignee: AMS AG, Premstätten (AT)

( * ) Notice: Subject to any disclaimer, the term of this patent is extended or adjusted under 35 U.S.C. 154(b) by 355 days.

(21) Appl. No.: 17/634,665

(22) PCT Filed: Jul. 21, 2020

(86) PCT No.: PCT/EP2020/070541
§ 371 (c)(1),
(2) Date: Feb. 11, 2022

(87) PCT Pub. No.: WO2021/028164
PCT Pub. Date: Feb. 18, 2021

(65) Prior Publication Data
US 2022/0359594 A1    Nov. 10, 2022

(30) Foreign Application Priority Data

Aug. 12, 2019  (EP) .................................. 19191268

(51) Int. Cl.
*H01L 27/146* (2006.01)
*G02B 1/116* (2015.01)

(52) U.S. Cl.
CPC ........ *H01L 27/14621* (2013.01); *G02B 1/116* (2013.01); *H01L 27/14623* (2013.01); *H01L 27/14625* (2013.01)

(58) Field of Classification Search
CPC .............................................. H01L 27/14625
See application file for complete search history.

(56) References Cited

U.S. PATENT DOCUMENTS 5,091,244 A    2/1992   Biornard
7,777,172 B2   8/2010   Hernoult
(Continued)

FOREIGN PATENT DOCUMENTS

JP    H05275731 A    10/1993
JP    H06326282 A    11/1994
(Continued)

OTHER PUBLICATIONS

Geetha S., "EMI Shielding: Methods and Materials—A Review", Journal of Applied Polymer Science, May 2009, 15 pages.
(Continued)

*Primary Examiner* — Yu-Hsi D Sun
(74) *Attorney, Agent, or Firm* — MH2 Technology Law Group LLP

(57) ABSTRACT

An optoelectronic device comprises a substrate with a photosensitive structure, a dielectric layer on a main surface of the substrate, the dielectric layer having a top surface facing away from the substrate. At least one wiring layer is arranged in the dielectric layer in places and at least one contact area is formed by a portion of the at least one wiring layer. An opening is formed at the top surface of the dielectric layer, the opening extending towards the contact area. An optical element is arranged on the top surface of the dielectric layer above the photosensitive structure and an optical filter is arranged on the top surface of the dielectric layer, the optical filter being electrically conductive, covering a portion of the optical element and being in electrical contact with the contact area. Furthermore, a method for producing an optoelectronic device is provided.

13 Claims, 4 Drawing Sheets

(56) References Cited

U.S. PATENT DOCUMENTS

| | | |
|---|---|---|
| 2006/0115230 A1 | 6/2006 | Komoguchi et al. |
| 2009/0162967 A1 | 6/2009 | Cheng et al. |
| 2012/0032241 A1 | 2/2012 | Huang et al. |
| 2014/0197301 A1 | 7/2014 | Velichko et al. |
| 2014/0264298 A1* | 9/2014 | Park .................. H10K 30/80 |
| | | 257/40 |
| 2016/0149058 A1 | 5/2016 | Bradley, Jr. et al. |
| 2016/0351617 A1 | 12/2016 | Frey et al. |
| 2019/0067345 A1 | 2/2019 | Qi et al. |
| 2019/0165024 A1 | 5/2019 | Bradley, Jr. et al. |
| 2019/0229143 A1 | 7/2019 | Wright |

FOREIGN PATENT DOCUMENTS

| | | |
|---|---|---|
| JP | H10-284712 A | 10/1998 |
| JP | 2007311664 A | 11/2007 |
| JP | 2010103378 A | 5/2010 |
| JP | 2011243785 A | 12/2011 |
| JP | 2016509374 A | 3/2016 |
| WO | 2016158128 A1 | 12/2017 |

OTHER PUBLICATIONS

International Search Report and Written Opinion in corresponding International Application No. PCT/EP2020/070541, mailed on Sep. 4, 2020, 16 pages.

Hara, T., Japanese Notice of Reasons for Rejection issued in corresponding Japanese Patent Application No. 2022 503576 on Mar. 7, 2023, 7 pages, with English language translation.

Hara, T., Japanese Decision to Grant issued in corresponding Japanese Patent Application No. 2022 503576 on Jul. 11, 2023, 4 pages, with English language translation.

Li, Y., Japanese Search Report issued in corresponding Japanese Patent Application No. 202080057069.1 on Dec. 14, 2024, 9 pages, with English language translation.

\* cited by examiner

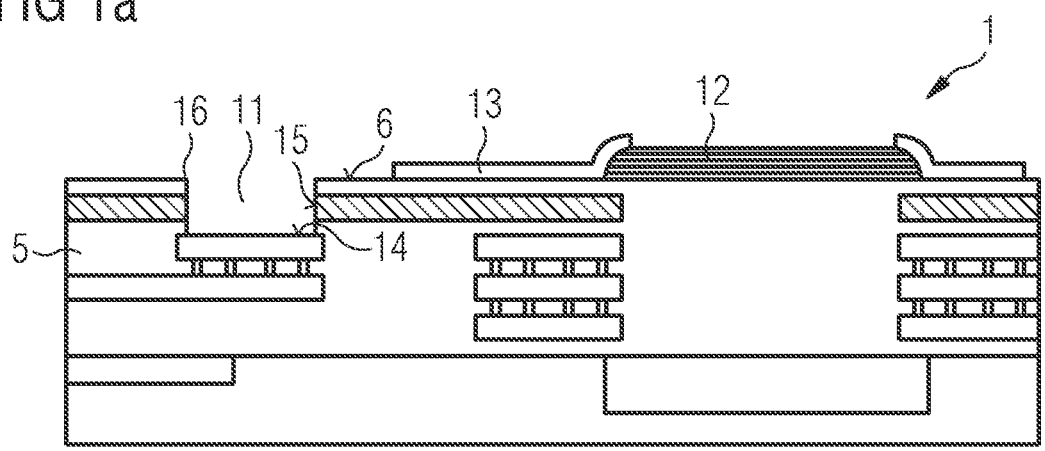
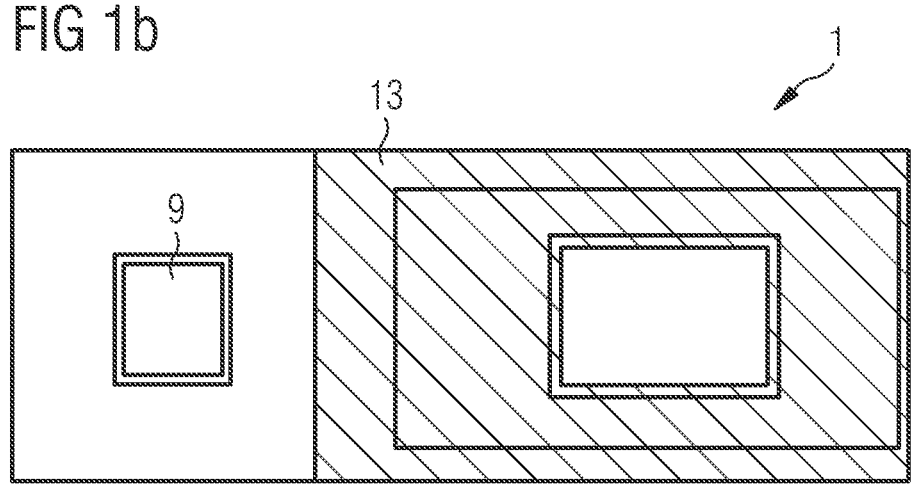

OPTOELECTRONIC DEVICE AND METHOD OF PRODUCING AN OPTOELECTRONIC DEVICE

CROSS-REFERENCE TO RELATED APPLICATIONS

The present application is the national stage entry of International Patent Application No. PCT/EP2020/070541, filed on Jul. 21, 2020, and published as WO 2021/028164 A1 on Feb. 18, 2021, which claims the benefit of priority of European Patent Application No. 19191268.2, filed on Aug. 12, 2019, all of which are incorporated by reference herein in their entirety.

FIELD OF THE INVENTION

The present application relates to an optoelectronic device and a method for producing an optoelectronic device.

BACKGROUND OF THE INVENTION

Many optoelectronic devices are suitable to detect electromagnetic radiation in a certain wavelength range. In order to prevent leakage of electromagnetic radiation and crosstalk between individual photosensitive structures within an optoelectronic device, frequently a certain area of the senor chip is covered by an optical filter. The optical filter is provided to absorb unwanted electromagnetic radiation at places, where the sensor chip is optically inactive. Besides, the optical filter prevents or reduces the reflectivity of the surface of the sensor chip. This is important, too, since reflected electromagnetic radiation could be scattered back and produce so-called "ghost images" on neighboured photosensitive structures. Therefore, the integration of an optical filter improves an optoelectronic device in terms of its optical properties.

However, by integrating optoelectronic devices in electronic systems, for example in dense packed camera systems of mobile devices, the optoelectronic device is in close proximity to other electric components. Electric components may produce electromagnetic fields, which possibly cause electromagnetic interference (EMI). This, in turn could cause degradation of individual devices and deterioration of the system performance. Furthermore, each electronic device is prone to damages caused by electrostatic discharge It is an objective to provide an optoelectronic device with improved optical and electrical properties. It is further an objective to provide a method of producing an optoelectronic device with improved optical and electrical properties.

This objective is achieved with the independent claims. Further embodiments and variants derive from dependent claims. The definitions as described above also apply to the following description unless otherwise stated.

SUMMARY OF THE INVENTION

In one embodiment the optoelectronic device comprises a substrate, which may comprise a semiconductor material, for example silicon (Si). The substrate can have a main plane of extension. The optoelectronic device may be a complementary metal-oxide-semiconductor (CMOS) device. The optoelectronic device may be arranged in a housing.

The optoelectronic device further comprises a photosensitive structure in the substrate, which, for example, can be a photodiode or an array of photodiodes. The photosensitive structure can also comprise a phototransistor or an array of phototransistors or any other suitable detection element for detecting electromagnetic radiation. The photosensitive structure can be arranged at a main surface of the substrate. The photosensitive structure can be surrounded by the substrate at side surfaces of the photosensitive structure. This means, the photosensitive structure can be surrounded by the substrate in lateral directions that run parallel to the main plane of extension of the substrate. A top side of the photosensitive structure can be free of the substrate. The photosensitive structure can be configured to detect electromagnetic radiation entering the optoelectronic device at a top side of the optoelectronic device. Wavelengths of the electromagnetic radiation may reach from the ultraviolet (UV) to the mid-infrared (MIR) spectrum.

The optoelectronic device further comprises a dielectric layer on the main surface of the substrate, the dielectric layer having a top surface facing away from the substrate. The dielectric layer is arranged above the substrate. The dielectric layer can be, for example, a doped or undoped siliconoxide (SiO2) layer. The dielectric layer can be formed by several deposition steps.

The optoelectronic device further comprises at least one wiring layer arranged in the dielectric layer in places. The at least one wiring layer comprises a metal, for example aluminum (Al). The at least one wiring layer may electrically connect different functional parts in the substrate, for example the gates of transistors in an integrated circuit (IC). The wiring layer can also electrically contact the photosensitive structure. In a vertical direction above the photosensitive structure the wiring layer is removed, where the vertical direction extends perpendicular to the main plane of extension of the substrate. This means, in a region above the photosensitive structure the dielectric layer is free of the wiring layer. This way, electromagnetic radiation entering the optoelectronic device is not blocked by the at least one wiring layer and can reach the photosensitive structure.

The optoelectronic device further comprises at least one contact area formed by a portion of the at least one wiring layer. The at least one contact area can be employed for electrically contacting the optoelectronic device. At a side facing away from the substrate the contact area is free of the dielectric layer. The contact area is an area at a surface of the wiring layer. The surface of the wiring layer can be larger than the contact area.

The optoelectronic device further comprises an opening in the dielectric layer at the top surface, the opening extending towards the contact area. The opening is formed as a trench extending within the dielectric layer in the vertical direction. The opening can have the same extent in the lateral directions as the contact area. Thus, the optoelectronic device can be electrically contacted from the top surface of the dielectric layer. The contact area can exhibit a constant electrical potential, for example a ground potential.

Besides, the optoelectronic device comprises an optical element arranged on the top surface of the dielectric layer above the photosensitive structure. The optical element is arranged above the photosensitive structure in the vertical direction. The optical element may be suitable to direct electromagnetic radiation of a certain wavelength or in a certain range of wavelengths towards the photosensitive structure.

Furthermore, the optoelectronic device comprises an optical filter arranged on the top surface of the dielectric layer. The optical filter is electrically conductive and in electrical contact with the contact area. It also covers a portion of the optical element. In this way, the optical filter provides an aperture towards the photosensitive structure. The optical filter can show a low angular dependency for incoming electromagnetic radiation. The optical filter can have a reflectivity of at most 0.2 in a wavelength range of 300 nm to 1200 nm. Preferably, the optical filter has a reflectivity of at most 0.03 in a wavelength range of 300 nm to 1200 nm. The optical filter absorbs unwanted electromagnetic radiation and prevents or reduces reflection on the surface of the optoelectronic device because of its optical properties. Besides, because of its electrical properties, it provides a shielding from EMI and a protection from ESD.

The optical filter improves the optical properties of the optoelectronic device. On the one hand, this is because the optical filter prevents or reduces reflection of electromagnetic radiation on the surface of the optoelectronic device. In case of no optical filter reflected electromagnetic radiation could be reflected back in an uncontrolled way, for example by the housing of the optoelectronic device.

On the other hand, the optical filter also absorbs electromagnetic radiation in places where the optoelectronic device is optically inactive. This means that the electromagnetic radiation is blocked from entering the optoelectronic device in places where no photosensitive structure lies underneath in the substrate. Therefore, electromagnetic radiation cannot enter the optoelectronic device at places, where the electromagnetic radiation would propagate and be reflected in an uncontrolled way.

This way, leakage of electromagnetic radiation is prevented. Besides, optical crosstalk between individual photosensitive structures is prevented. This in turn improves the signal-to-noise ratio and thus the accuracy of the optoelectronic device.

The optical filter also improves the electrical properties of the optoelectronic device. This is because the optical filter is electrically connected to a contact area, which can have a fixed electrical potential, for example a ground potential. Thus, the optoelectronic device is protected from ESD, since electrical charges can discharge and thus do not cause damage to electronic components of the device.

Besides, because of being electrically conductive the optical filter shields the optoelectronic device from electromagnetic fields and isolates it from its surrounding environment. This way, the optical filter provides protection against interfering signals, for example radio frequency (RF) signals.

In an embodiment the optical filter covers a bottom part, the sidewalls and the edges of the opening at the top surface of the dielectric layer. The bottom part of the opening is the part of the opening facing the contact area. The sidewalls of the opening extend perpendicular or transverse to the main plane of extension of the substrate. The edges of the opening are arranged at the top surface of the dielectric layer. The edges delimit the opening. The optical filter can be in direct contact with the contact area. This way, the optical filter is electrically connected to the contact area. By electrically connecting the optical filter to a fixed constant potential via the contact area, the optical filter provides ESD-protection to the optoelectronic device. It also provides EMI-shielding to the optoelectronic device.

In another embodiment the optoelectronic device further comprises a spacer structure covering the bottom part, the sidewalls and the edges of the opening at the top surface of the dielectric layer. The spacer structure is in direct contact with the contact area and with the optical filter. This way, the spacer structure electrically connects the contact area to the optical filter. When using a spacer structure the optical filter can be thin in the vertical direction, since it does not have to cover the edges of the opening of the dielectric layer. Thin layers have less intrinsic stress than thick layers and can be patterned more easily. Thus, using thin layers for realizing the optical filter can be advantageous, if there are limitations regarding mechanical stress or special requirements for the patterning of the optical filter.

In an embodiment the spacer structure comprises a stack of at least two electrically conductive layers.

For example, the spacer structure may comprise a first electrically conductive layer, a second electrically conductive layer and a third electrically conductive layer. The first electrically conductive layer can comprise Al. The second electrically conductive layer can comprise titanium (Ti). The third electrically conductive layer can comprise indium tin oxide (ITO). However, the spacer structure is not limited to comprise those materials and may comprise any other suitable materials. The advantage of a layer stack comprising Al, Ti and ITO is that Al has a good electrical conductivity and is compatible to CMOS processing. The Ti-layer is provided as a buffer layer and to provide good adhesion of the ITO-layer. The ITO-layer prevents corroding of the Al-layer. The electrically conductive layers are arranged on top of each over. The second electrically conductive layer covers the first electrically conductive layer. The third electrically conductive layer covers the second electrically conductive layer. The second conductive layer can be arranged between the first conductive layer and the third conductive layer in vertical direction. The first conductive layer can be arranged closer to the substrate than the second and the third conductive layer.

In an embodiment the optical filter comprises an electrically conductive layer. The electrically conductive layer may comprise, for example, Al. However, the electrically conductive layer of the optical filter is not limited to be an Al-layer and may comprise any other suitable electrically conductive material. The optical filter further comprises an anti-reflective coating on top of the electrically conductive layer. This means, the anti-reflective coating is arranged at the side of the electrically conductive layer that faces away from the substrate. The anti-reflective coating comprises, for example, a stack of alternating dielectric and metallic layers. The anti-reflective coating may also comprise a stack of alternating dielectric layers. The anti-reflective coating may also comprise a stack of alternating nitride and metallic layers. The amount as well as the thickness of the alternating layers can vary depending on the application.

The electrically conductive layer of the optical filter is provided for the electrical conductivity of the optical filter as well as for the absorption of unwanted electromagnetic radiation. The anti-reflective coating of the optical filter is provided for the reduction of the reflectivity of the surface of the optoelectronic device facing the entering electromagnetic radiation. The anti-reflective coating shows a low angular dependency for incoming electromagnetic radiation. For example, the reflectivity of the anti-reflective coating is less than 0.2 in a wavelength range of 300 nm to 1200 nm. Preferably, the reflectivity of the anti-reflective coating can have a reflectivity of at most 0.03 in a wavelength range of 300 to 1200 nanometer.

In another embodiment the optical filter comprises an electrically conductive black chromium coating. The black chromium coating is a layer arranged at the top side of the optoelectronic device. The black chromium coating comprises chromium. For example, the reflectivity of the black chromium coating is typically less than 5% in a wavelength range of 300 to 1200 nanometer.

The electrically conductive black chromium coating is provided for the electrical conductivity of the optical filter and for the absorption of unwanted electromagnetic radiation as well as for the reduction of reflectivity of the surface of the optoelectronic device facing the entering electromagnetic radiation.

In another embodiment the optical filter comprises an electrically conductive layer and a black chromium layer on top of the electrically conductive layer. The electrically conductive layer may comprise, for example, metallic chrome (Cr) or any other suitable material like Al, Ti or silver (Ag).

The electrically conductive layer is provided for the electrical conductivity of the optical filter and for the absorption of unwanted electromagnetic radiation. The black chromium layer is provided for further absorption of electromagnetic radiation as well as for reduction of reflectivity of the surface of the optoelectronic device facing the entering electromagnetic radiation.

In another embodiment the optical filter comprises an electrically conductive organic color coating. The organic color coating is a layer arranged at the top side of the optoelectronic device. The organic color coating comprises an organic material, for example a resist. For example, the reflectivity of the organic color coating is less than 0.2 in a wavelength range of 300 to 1200 nanometer. Preferably, the reflectivity of the organic color coating can have a reflectivity of at most 0.03 in a wavelength range of 300 to 1200 nanometer. The electrical conductivity of the organic color coating may be realized by the addition of carbon nanotubes or carbon black or by the addition of electrically conductive polymers like PEDOT:PSS.

The electrically conductive organic color coating is provided for the electrical conductivity of the optical filter and for the absorption of unwanted electromagnetic radiation as well as for the reduction of reflectivity of the surface of the optoelectronic device facing the entering electromagnetic radiation.

In a further embodiment the optical filter comprises an electrically conductive layer, for example a layer comprising Al, and an organic color coating on top of the electrically conductive layer.

The electrically conductive layer is provided for the electrical conductivity of the optical filter and for the absorption of unwanted electromagnetic radiation. The organic color coating is provided for further absorption of electromagnetic radiation as well as for reduction of reflectivity of the surface of the optoelectronic device facing the entering electromagnetic radiation.

In a further embodiment the optoelectronic device comprises a passivation layer arranged in the dielectric layer in places. The passivation layer may comprise, for example, silicon-nitride (Si3N4). The passivation layer is arranged above the at least one wiring layer. This means, in vertical direction the wiring layer is arranged between the passivation layer and the substrate. In vertical direction above the photosensitive structure the passivation layer is removed. This means, in a region above the photosensitive structure the dielectric layer is free of the passivation layer. This way, electromagnetic radiation entering the optoelectronic device is not blocked by the passivation layer and can reach the photosensitive structure. Besides, unwanted interference of the electromagnetic radiation on the passivation layer is prevented. The passivation layer is also removed in the region above the contact area by forming the opening in the dielectric layer as described above.

By using a passivation layer the optoelectronic device becomes more resistant to the environment. For example, the optoelectronic device becomes more resistant to scratches or humidity.

In a further embodiment the optoelectronic device comprises an IC in the substrate. The IC can be arranged in beside the photosensitive structure in the substrate. This means that in lateral directions, that run parallel to the main plane of extension of the substrate, the IC can be adjacent to the photosensitive structure. The IC also can be arranged in the vertical direction under the photosensitive structure in the substrate.

By employing an IC, the photosensitive structure can be controlled. Electrical signals coming from the photosensitive structure can be processed efficiently. Besides, the optoelectronic device can communicate with other electrical components via the IC.

In a further embodiment the optical element of the optoelectronic device is an interference filter. The interference filter can comprise a stack of alternating dielectric and metallic layers. The interference filter can be realized as, for example, a longpass filter or a bandpass filter.

The purpose of using an interference filter is to transmit only a certain wavelength or a certain range of wavelengths to the photosensitive structure. This way, the signal-to-noise ratio of the optoelectronic device can be improved.

In a further embodiment the photosensitive structure is a single photodiode or an array of photodiodes. In case of an array of photodiodes, the array can have a rectangular shape. In the array, the photodiodes can be arranged at lattice points of a lattice. The lattice can be linear or two-dimensional. The photodiodes in an array can be arranged beside each other. This means that in lateral directions the photodiodes can be adjacent to each other. Each photodiode in an array of photodiodes can be arranged within the optoelectronic device as described above. This means that the region in the dielectric layer above each photodiodes is free of a wiring layer and free of a passivation layer and there is an optical element on the top surface of the dielectric layer above each photodiode and the optical filter forms an aperture towards each photodiode. By using an array of photodiodes applications like imaging are possible.

In a further embodiment the optoelectronic device is incorporated in an electronic device. The electronic device can be, for example, a camera system. The camera system can be used for imaging a scene in a desired wavelength range. For example, the camera system can be used for imaging in the visible light spectrum. The camera system can advantageously be arranged in close proximity to other electronic components, since due to the EMI-shielding properties of the optical filter the camera system is more resistant to issues relating to electromagnetic interference. The optoelectronic device is not limited to be incorporated in a camera system, but it can be incorporated in any electronic device such as an electromagnetic radiation sensor device.

Furthermore, a method of producing an optoelectronic device is provided. All features disclosed for the optoelectronic device are also disclosed for the method for producing the optoelectronic device and vice-versa.

The method of producing an optoelectronic device comprises providing a substrate and forming a photosensitive structure in the substrate. In case of the photosensitive structure being a photodiode, the photodiode can be realized by ion-implantation. A dielectric layer is deposited on top of the substrate, the dielectric layer having a top surface facing away from the substrate. The deposition of the dielectric layer can comprise several deposition steps. The deposition can be realized by chemical vapor deposition (CVD), for example. The dielectric layer can be in direct contact with the substrate.

At least one wiring layer is deposited and arranged in places within the dielectric layer. This means a part of the dielectric layer is deposited on the substrate, and the wiring layer is deposited on the dielectric layer. Afterwards, another deposition step for the deposition of the dielectric layer follows so that the wiring layer is arranged in places within the dielectric layer. The wiring layer can be deposited by a sputter process and patterned by an etching procedure.

The wiring layer forms a contact area in places. This means, a part of the wiring layer, namely the contact area, is configured to be electrically contacted. The wiring layer can be removed above the photosensitive structure.

An opening is formed at the top surface of the dielectric layer, the opening extending towards the contact area. The opening is formed by removing the material arranged above the contact area. The opening can be formed by etching.

An optical element is deposited on the dielectric layer, the optical element being arranged in a vertical direction above the photosensitive structure. The optical element can be deposited, for example, by CVD, atomic layer deposition (ALD) or physical vapor deposition (PVD). The patterning of the optical element can be done by etching.

An optical filter is deposited. The optical filter can be deposited in places on the top surface of the dielectric layer and on a portion of the optical element. Depending on the used materials for the optical filter the deposition technique can include CVD, ALD, PVD, spin coating or sputter processes. The patterning of the optical filter can be done, for example, by etching.

In one embodiment of the method of producing an optoelectronic device the optical filter is arranged on the top surface of the dielectric layer in places, on a portion of the optical element and in the opening of the dielectric layer, the optical filter covering a bottom part, the sidewalls and the edges of the opening at the top surface of the dielectric layer. This way, the optical filter is electrically connected to the contact area. By electrically connecting the optical filter to a fixed constant potential via the contact area, the optical filter provides ESD-protection to the optoelectronic device.

In another embodiment of the method of producing an optoelectronic device a spacer structure is deposited into the opening of the dielectric layer and onto the contact area before the deposition of the optical filter, the spacer structure covering a bottom part, the sidewalls and the edges of the opening at the top surface of the dielectric layer. The spacer structure is in direct contact with the contact area. The deposition technique for the spacer structure depends on the materials used. It can, for example, include sputter techniques. The used material layers for the spacer structure can be patterned by etching. The optical filter is deposited after the deposition of the spacer structure. When using a spacer structure the optical filter can be thin in the vertical direction, since it does not have to cover the edges of the opening in the dielectric layer.

In another embodiment of the method of producing an optoelectronic device the optical filter is arranged on the top surface of the dielectric layer in places, on a portion of the optical element and on a portion of the spacer structure. This way, the optical filter is electrically connected to the contact area. By electrically connecting the optical filter to a fixed constant potential via the contact area, the optical filter provides ESD-protection to the optoelectronic device.

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

BRIEF DESCRIPTION OF THE DRAWINGS

FIG. 1a shows a cross-section of an example for an optoelectronic device using an optical filter.

In FIG. 1b the top-view of an example for an optoelectronic device using an optical filter is shown.

DETAILED DESCRIPTION

Figure 2A:
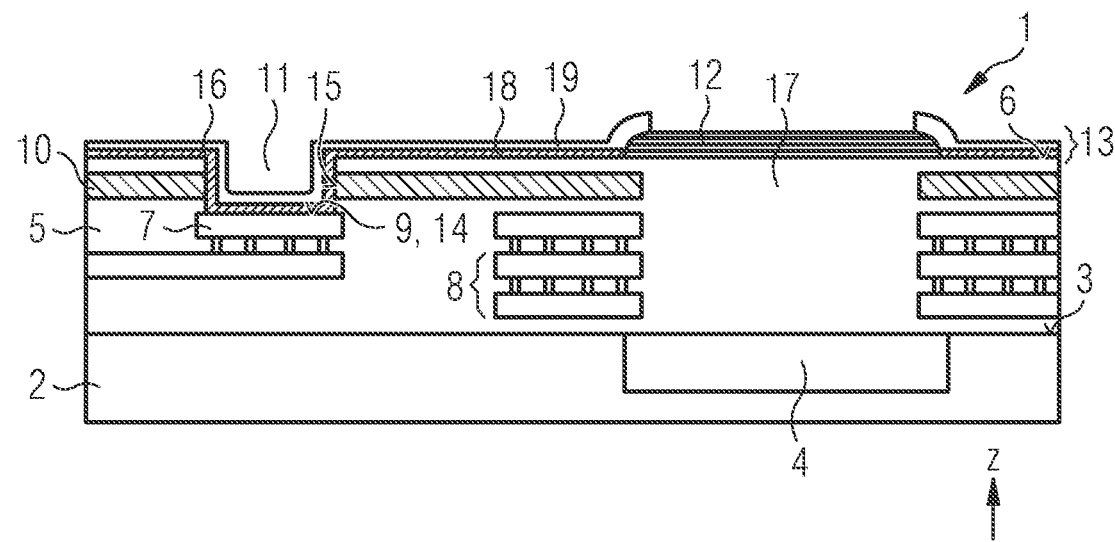
FIG. 2a shows a cross-section of an exemplary embodiment of the optoelectronic device using an optical filter in electrical contact with a contact area.

In FIG. 1a a cross-sectional view of an example for an optoelectronic device 1, which is no embodiment, is shown. The feature to be highlighted here is an optical filter 13, which covers a portion of a top surface 6 of a dielectric layer 5 and a portion of an optical element 12. The optical filter 13 does not cover a bottom part 14, the sidewalls 15 and the edges 16 of an opening 11 at the top surface 6 of the dielectric layer 5. Thus, the optical filter 13 is not electrically connected to a fixed electrical potential. Thus, the optical filter 13 cannot provide EMI-shielding or ESD-protection.

With FIG. 1b a top-view of the example for an optoelectronic device 1 given in FIG. 1a is shown. The optical filter 13 is spaced from the contact area 9. Thus, it becomes clear that the optical filter 13 does cover the contact area 9.

FIG. 2a shows a cross-sectional view of one exemplary embodiment of the optoelectronic device 1. Elements according to FIG. 2a that correspond to elements of the example according to FIG. 1a are designated with the same reference numerals.

The optoelectronic device 1 according to FIG. 2a comprises a substrate 2 and a photosensitive structure 4 at a main surface 3 of the substrate 2. The substrate 2 can have a main plane of extension. The photosensitive structure 4 can comprise a photodiode, as shown schematically. The optoelectronic device 1 can also comprise a plurality of photosensitive structures 4, for example arranged in an array. In an array, each photosensitive structure 4 can be arranged in a similar way as shown in FIG. 2a. The photosensitive structures 4 in an array can be arranged either next to each other in the cross-sectional plane or in a plane perpendicular to the cross-sectional plane.

A dielectric layer 5 is arranged on top of the substrate 2 at its main surface 3. The dielectric layer 5 has a top surface 6 facing away from the substrate 2.

In the dielectric layer 5 at least one wiring layer 7 is arranged. In the embodiment shown in FIG. 2a two further wiring layers 8 are arranged in the dielectric layer 5. The wiring layer 7 and the further wiring layers 8 may be connected to each other. The wiring layer 7 and the further wiring layers 8 may also connect functional parts in the substrate 2, for example the gates of an IC. An IC is not shown in FIG. 2a. In a vertical direction z above the photosensitive structure 4 the wiring layers 7 and the further wiring layers 8 are removed, where the vertical direction z extends perpendicular to the main plane of extension of the substrate 2. This means, in a region above the photosensitive structure 4 the dielectric layer 5 is free of the wiring layer 7 and of the further wiring layers 8.

At least one contact area 9 is formed by a portion of the wiring layer 7. At a side facing away from the substrate 2 the contact area 9 is free of the dielectric layer 5. The contact area 9 can have a fixed electrical potential, for example a ground potential. The fixed electrical potential can be provided by a further contact area, which is electrically connected to the contact area 9. A further contact area is not shown in FIG. 2a.

A passivation layer 10 is arranged in the dielectric layer 5 above the wiring layer 7 and the further wiring layers 8. This means, in vertical direction z the wiring layer 7 and the further wiring layers 8 are arranged between the passivation layer 10 and the substrate 2. A portion of the passivation layer 10 is removed above the photosensitive structure 4. This means, in a region above the photosensitive structure 4 the dielectric layer 5 is free of the passivation layer 10. The passivation layer 10 is also removed in a region above the contact area 9.

At the top surface 6 of the dielectric layer 5 an opening 11 is formed, penetrating the dielectric layer 5 and the passivation layer 10 and extending towards the contact area 9. This means that in a vertical direction z the region above the contact area 9 at a side facing away from the substrate 2 is free of the dielectric layer 5 and the passivation layer 10. The depth of the opening 11 from the top surface 6 of the dielectric layer 5 to the contact area 9 may be at least 0.3 micrometer and at most 10 micrometer. Alternatively, the depth of the opening 11 from the top surface 6 of the dielectric layer 5 to the contact area 9 may be at least 0.5 micrometer and at most 3 micrometer.

An optical element 12 is arranged on the top surface 6 of the dielectric layer 5 above the photosensitive structure 4. In the embodiment shown in FIG. 2a the optical element 12 comprises an interference filter 12. The interference filter 12 comprises a stack of alternating layers, for example a stack of alternating oxide and metallic layers.

An optical filter 13 is arranged on the top surface 6 of the dielectric layer 5. The optical filter 13 covers a bottom part 14, the sidewalls 15 and the edges 16 of the opening 11 at the top surface 6 of the dielectric layer 5. Thus, the optical filter 13 is in direct contact with the contact area 9. Thus, the optical filter 13 is also in electrical contact with the contact area 9. The optical filter 13 also covers the top surface 6 of the dielectric layer 5 in places and a portion of the optical element 12. The optical filter 13 is removed on a main part of the optical element 12 above the photosensitive structure 4.

The removal of the optical filter 13 as well as of the passivation layer 10, the wiring layer 7 and the further wiring layer 8 forms an aperture 17 towards the photosensitive structure 4. This means that in a vertical direction z above the photosensitive structure 4 the optoelectronic device 1 is free of these layers. The aperture 17 extends also in the plane perpendicular to the cross-sectional plane. The shape of the aperture 17 can correspond to the shape of the photosensitive structure 4 (see also FIG. 2c).

In the embodiment shown in FIG. 2a the optical filter 13 comprises an electrically conductive layer 18 as well as an anti-reflective coating 19, a black chromium coating 19 or an organic color coating 19 on top of the electrically conductive layer 18. The electrically conductive layer 18 is provided for the electrical conductivity as well as for the absorption of unwanted electromagnetic radiation. The electrically conductive layer 18 can comprise any material that has favorable electrical, mechanical and optical properties. The thickness of the electrically conductive layer 18 has to be in the range that the step coverage from the top surface 6 of the dielectric layer 5 to the contact area 9 is feasible. The anti-reflective coating 19 or the black chromium coating 19 or the organic color coating 19 is provided for additional absorption of unwanted electromagnetic radiation and for reducing the reflectivity of the surface of the optoelectronic device 1. The overall thickness of the optical filter 13, which means of the electrically conductive layer 18 plus the anti-reflective coating 19 or the black chromium coating 19 or the organic color coating 19, can be at least 0.2 micrometer and at most 10 micrometer. Alternatively, the overall thickness of the optical filter can be at least 0.2 micrometer and at most 5 micrometer.

Figure 2B:
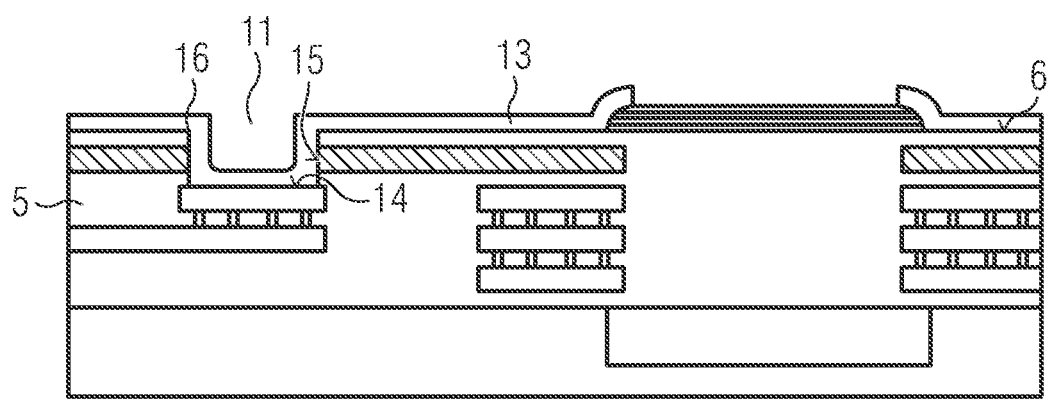
FIG. 2b shows a cross-section of another exemplary embodiment of the optoelectronic device using an optical filter in electrical contact with a contact area.

FIG. 2b shows a cross-sectional view of another exemplary embodiment of the optoelectronic device 1.

Figure 2C:
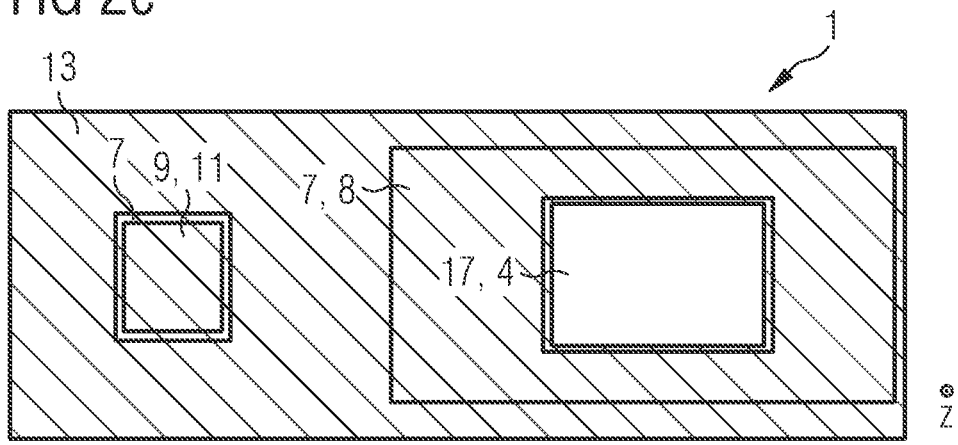
In FIG. 2c the top-view of an embodiment of the optoelectronic device using an optical filter in electrical contact with a contact area is shown.

The embodiment according to FIG. 2b differs from the embodiment according to FIG. 2a in the realization of the optical filter 13. In this embodiment the optical filter 13 comprises only one electrically conductive layer with suitable optical properties. The optical filter 13 can comprise an electrically conductive black chromium coating or an electrically conductive organic color coating. In both cases the thickness of the optical filter 13 has to be thick enough to cover the bottom part 14, the sidewalls 15 and the edges 16 of the opening 11 at the top surface 6 of the dielectric layer 5. Thus, the thickness of the optical filter is in the same range as in the embodiment of FIG. 2a. FIG. 2c shows a top-view of the embodiments according to FIGS. 2a and 2b.

A portion of the wiring layer 7 forms a contact area 9 in places, where the opening 11 in the dielectric layer 5 is formed. In this embodiment the shape of the contact area 9 is rectangular in top view, but it can have any suitable shape, for example a circular or polygonal shape.

The wiring layer 7 and the further wiring layers 8 also form an aperture 17 towards the photosensitive structure 4. The shape of the aperture 17 in top view corresponds to the shape of the photosensitive structure, in this case a rectangular shape. However, the shape of the photosensitive structure can have any suitable shape, for example a circular or polygonal shape. The size of the aperture 17 can be smaller than the size the photosensitive structure 4.

On the one hand, due to the aperture 17 in the wiring layers 7 and 8, the passivation layer 10 and the optical filter 13 electromagnetic radiation entering the optoelectronic device 1 can reach the photosensitive structure 4 without being blocked. On the other hand, the wiring layer 7 and the further wiring layer 8, which surround the photosensitive structure 4 in a vertical direction z, prevent scattered electromagnetic radiation from reaching the photosensitive structure 4. This way, the arrangement of the wiring layer 7 and the further wiring 8 additionally prevents crosstalk between individual photosensitive structures 4.

The optical filter 13 covers the contact area 9. Thus, the optical filter 13 is in direct contact with the contact area 9 and electrically connected to the contact area 9.

Figure 2D:
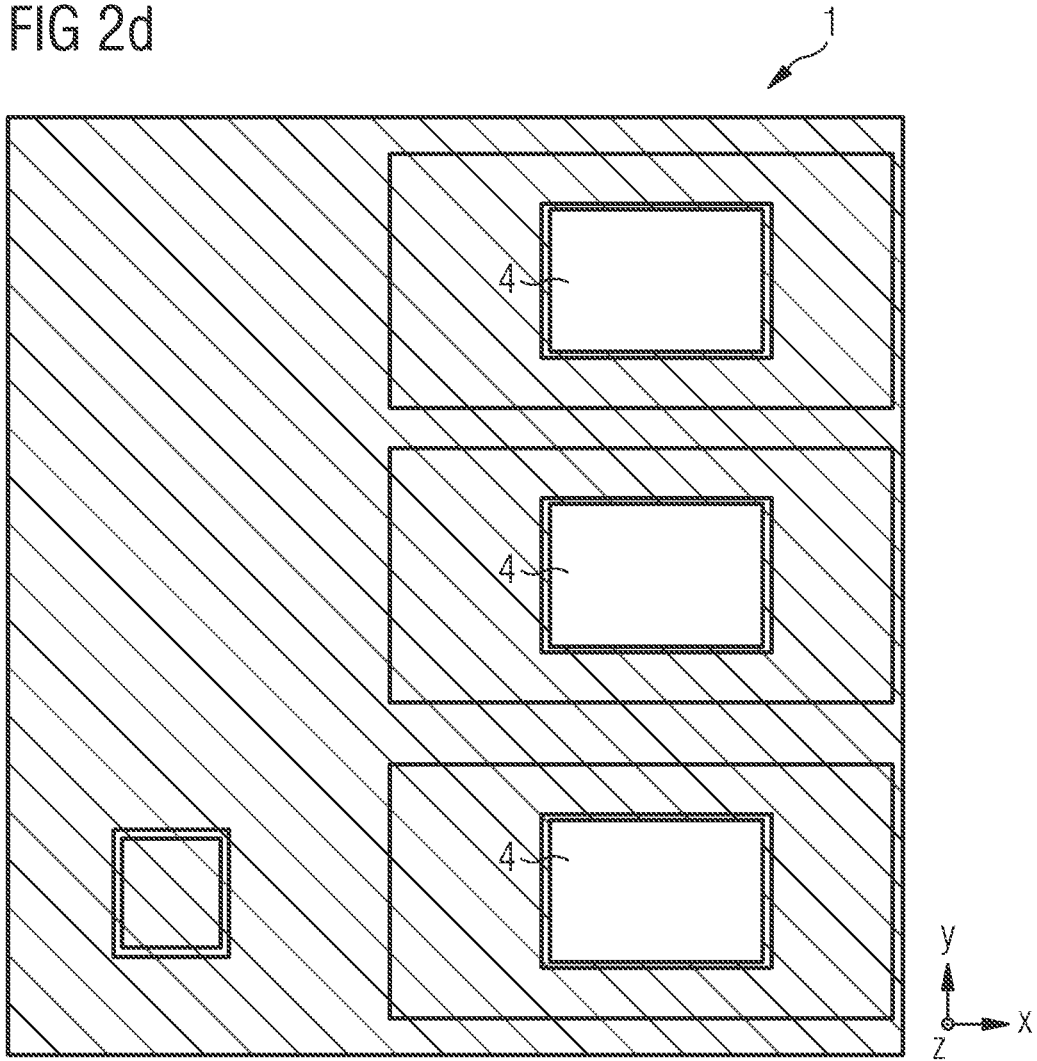
FIG. 2d shows a top-view of an embodiment of the optoelectronic device comprising an array of photosensitive structures.

With FIG. 2d a top-view of another embodiment is shown, wherein the optoelectronic device 1 comprises an array of photosensitive structures 4. In this embodiment, the array of photosensitive structures 4 comprises three photosensitive structures 4 and extends in a lateral direction y. The array of photosensitive structures 4 can also extend in another lateral direction x, which is perpendicular to the lateral direction y. The array of photosensitive structures 4 can also extend in both the lateral direction y and the other lateral direction x to form a two-dimensional array. In each lateral direction the array of photosensitive structures 4 can comprise any number of photosensitive structures 4.

Figure 3A:
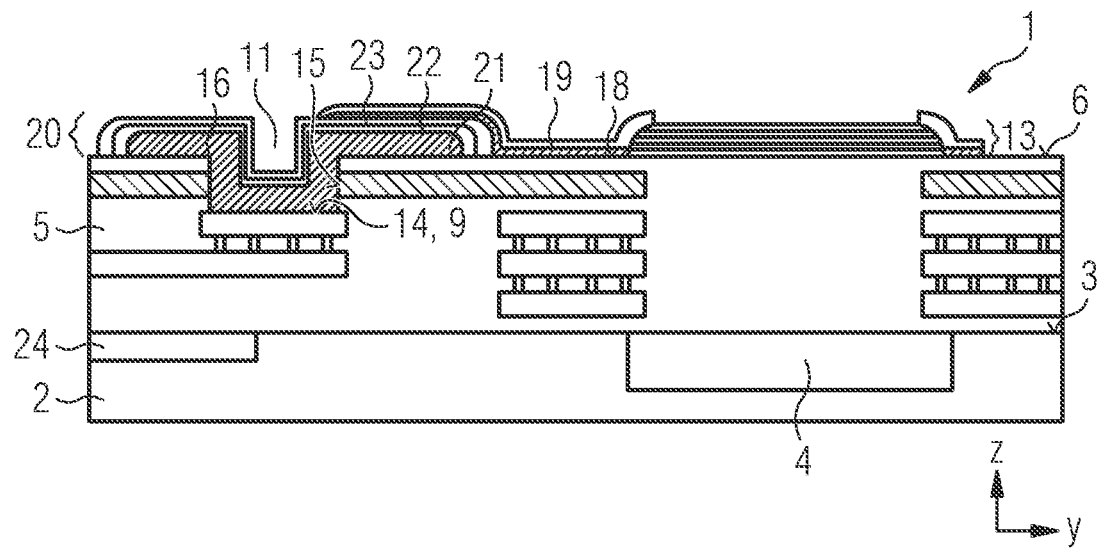
FIG. 3a shows a cross-section of an exemplary embodiment of the optoelectronic device using a spacer structure to connect the contact area to the optical filter.

FIG. 3a shows a cross-sectional view of another exemplary embodiment of the optoelectronic device 1. Elements according to FIG. 3a that correspond to elements of the embodiment according to FIG. 2a are designated with the same reference numerals.

The embodiment according to FIG. 3a differs from the embodiment according to FIG. 2a in the fact that a spacer structure 20 covers the bottom part 14, the sidewalls 15 and the edges 16 of the opening 11 at the top surface 6 of the dielectric layer 5. Thus, the spacer structure 20 is in direct contact with the contact area 9. The spacer structure 20 comprises three electrically conductive layers. The first electrically conductive layer 21, which is closest to the substrate 2 and in direct contact with the contact area 9, may comprise Al. The second conductive layer 22, which is arranged between the first electrically conductive layer 21 and the third electrically conductive layer 23, may comprise Ti. The third electrically conductive layer 23, which in a vertical direction z is the topmost layer, may comprise ITO.

The overall thickness of the spacer structure 20 has to be thick enough to cover the bottom part 14, the sidewalls 15 and the edges 16 of the opening 11 at the top surface 6 of the dielectric layer 5. The thickness of the first electrically conductive layer 21 may be 0.3 to 10 micrometer. The thickness of the second electrically conductive layer 22 may be 10 nanometer to 1 micrometer. The thickness of the third electrically conductive layer 23 may be 10 nanometer to 1 micrometer. Alternatively, the thickness of the first electrically conductive layer 21 may be 0.5 to 1.5 micrometer. Alternatively, the thickness of the second electrically conductive layer 22 may be 20 to 200 nanometer. Alternatively, the thickness of the third electrically conductive layer 23 may be 50 to 200 nanometer.

The optical filter 13 covers a portion of the spacer structure 20. Thus, the optical filter 13 is electrically connected to the contact area 9. In the embodiment according to FIG. 3a the optical filter 13 comprises an electrically conductive layer 18 as well as an anti-reflective coating 19 or a black chromium coating 19 or an organic color coating 19. The electrical and optical properties of the material layers used for the optical filter 13 are the same as described above in the embodiment of FIG. 2a. But the overall thickness of the optical filter 13 can be reduced, since the optical filter 13 does not have to cover the bottom part 14, the sidewalls 15 and the edges 16 of the opening 11 at the top surface 6 of the dielectric layer 5. The overall thickness of the optical filter 13 in vertical direction z can be at least 50 nanometer and at most 2 micrometer. Alternatively, the overall thickness of the optical filter 13 in vertical direction z can be at least 150 nanometer and at most 800 nanometer.

Besides, with FIG. 3a an IC 24 is shown within the substrate 2 of the optoelectronic device 1. In this embodiment the IC 24 is arranged at the main surface 3 of the substrate 2 in the lateral direction x beside the photosensitive structure 4. The IC 24 can also be arranged in the vertical direction z under the photosensitive structure 4 in the substrate 2.

Figure 3B:
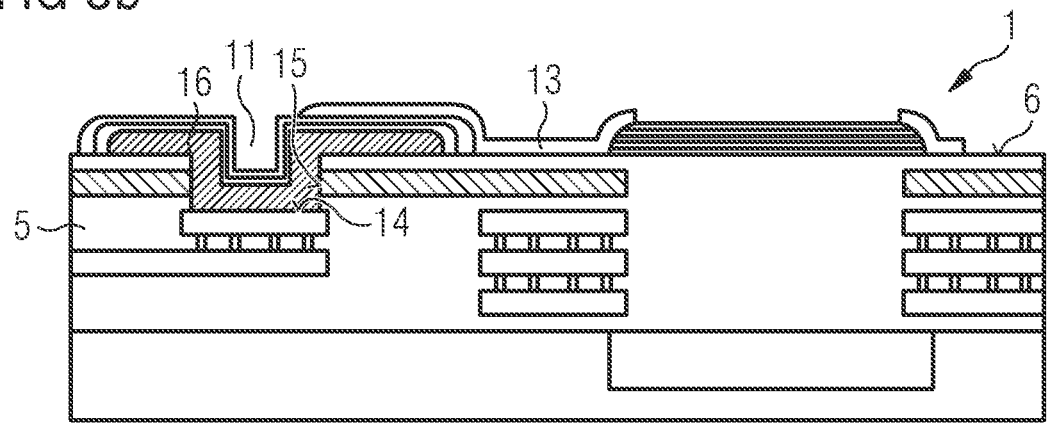
FIG. 3b shows a cross-section of another exemplary embodiment of the optoelectronic device using a spacer structure to connect the contact area to the optical filter.

FIG. 3b shows a cross-sectional view of another exemplary embodiment of the optoelectronic device 1. Elements according to FIG. 3b that correspond to elements of the embodiment according to FIG. 3a are designated with the same reference numerals.

The embodiment according to FIG. 3b differs from the embodiment according to FIG. 3a in the realization of the optical filter 13. In this embodiment the optical filter 13 comprises only one electrically conductive layer with suitable optical properties. The optical filter 13 can comprise an electrically conductive black chromium coating or an electrically conductive organic color coating. The thickness of the optical filter 13 can be reduced compared to the embodiment of FIG. 2b, since the optical filter 13 does not have to cover the bottom part 14, the sidewalls 15 and the edges 16 of the opening 11 at the top surface 6 of the dielectric layer 5. The thickness of the optical filter 13 can be at least 0.1 micrometer and at most 5 micrometer. Alternatively, the thickness of the optical filter 13 can be at least 0.1 micrometer and at most 0.8 micrometer, depending on the used materials.

Figure 4:
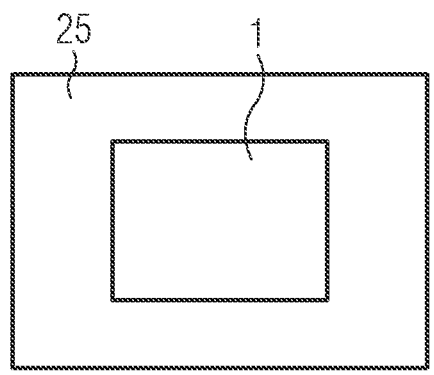
FIG. 4 shows a schematic diagram of an electronic device comprising the optoelectronic device.

FIG. 4 shows a schematic diagram of an electronic device 25 comprising the optoelectronic device 1. The electronic device 25 can be, for example, a camera system or an electromagnetic radiation sensor. The electronic device 25 can be employed for applications in the automotive, the industrial, the medical, the consumer market and the scientific field, for example.

The invention claimed is:

1. An optoelectronic device, comprising:
a substrate with a photosensitive structure,
a dielectric layer on a main surface of the substrate, the dielectric layer having a top surface facing away from the substrate,
at least one wiring layer arranged in the dielectric layer in places,
at least one contact area formed by a portion of the at least one wiring layer,
an opening in the dielectric layer at the top surface, the opening extending towards the contact area,
an optical element arranged on the top surface of the dielectric layer above the photosensitive structure, and
an optical filter arranged on the top surface of the dielectric layer, the optical filter being electrically conductive, covering a portion of the optical element, providing an aperture towards the photosensitive structure, and being in electrical contact with the contact area.

2. The optoelectronic device according to claim 1, wherein
the optical filter covers a bottom part, the sidewalls and the edges of the opening at the top surface of the dielectric layer and electrically contacts the contact area.

3. The optoelectronic device according to claim 1, comprising:
a spacer structure, the spacer structure covering a bottom part, the sidewalls and the edges of the opening at the top surface of the dielectric layer and electrically connecting the contact area to the optical filter.

4. The optoelectronic device according to claim 3, wherein
the spacer structure (20) comprises a stack of at least two electrically conductive layers.

5. The optoelectronic device according to claim 1, wherein
the optical filter comprises an electrically conductive layer.

6. The optoelectronic device according to claim 1, wherein
the optical filter comprises an anti-reflective coating, an organic color coating or a black chromium coating.

7. The optoelectronic device according to claim 1, comprising:
a passivation layer arranged in places in the dielectric layer above the at least one wiring layer.

8. The optoelectronic device according to claim 1, comprising:
an integrated circuit in the substrate.

9. The optoelectronic device according to claim 1, wherein
the optical element is an interference filter.

10. The optoelectronic device according to claim 1, wherein
the photosensitive structure (4) is a single photodiode or an array of photodiodes.

11. An electronic device comprising an optoelectronic device according to claim 1, wherein in particular the electronic device is a camera system or an electromagnetic radiation sensor.

12. An optoelectronic device, comprising:
a substrate with a photosensitive structure,
a dielectric layer on a main surface of the substrate, the dielectric layer having a top surface facing away from the substrate,
at least one wiring layer arranged in the dielectric layer in places,
at least one contact area formed by a portion of the at least one wiring layer,
an opening in the dielectric layer at the top surface, the opening extending towards the contact area,
an optical element arranged on the top surface of the dielectric layer above the photosensitive structure, and
an optical filter comprising an anti-reflective coating, an organic color coating or a black chromium coating, arranged on the top surface of the dielectric layer, the optical filter being electrically conductive, covering a portion of the optical element and being in electrical contact with the contact area.

13. An optoelectronic device, comprising:
a substrate with a photosensitive structure,
a dielectric layer on a main surface of the substrate, the dielectric layer having a top surface facing away from the substrate,
at least one wiring layer arranged in the dielectric layer in places,
at least one contact area formed by a portion of the at least one wiring layer,
an opening in the dielectric layer at the top surface, the opening extending towards the contact area,
an optical element comprising an interference filter, arranged on the top surface of the dielectric layer above the photosensitive structure, and
an optical filter arranged on the top surface of the dielectric layer, the optical filter being electrically conductive, covering a portion of the optical element and being in electrical contact with the contact area.

* * * * *